(12) United States Patent
Seok et al.

(10) Patent No.: US 11,355,167 B2
(45) Date of Patent: Jun. 7, 2022

(54) CIRCUITS AND METHODS FOR IN-MEMORY COMPUTING

(71) Applicant: The Trustees of Columbia University in the City of New York, New York, NY (US)

(72) Inventors: Mingoo Seok, Tenafly, NJ (US); Zhewei Jiang, Oakland Gardens, NY (US); Jae-sun Seo, Tempe, AZ (US); Shihui Yin, Mesa, AZ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 17/356,211

(22) Filed: Jun. 23, 2021

(65) Prior Publication Data
US 2021/0327474 A1    Oct. 21, 2021

Related U.S. Application Data

(63) Continuation of application No. PCT/US2019/068495, filed on Dec. 24, 2019.
(Continued)

(51) Int. Cl.
*G06F 7/501* (2006.01)
*G11C 15/04* (2006.01)
(Continued)

(52) U.S. Cl.
CPC ............ *G11C 7/1036* (2013.01); *G06F 7/501* (2013.01); *G06F 7/5443* (2013.01);
(Continued)

(58) Field of Classification Search
CPC ... G11C 7/1036; G11C 7/1051; G11C 7/1078; G11C 16/3404; G11C 15/04; G11C 15/043; G06F 7/501; G06F 7/5443
(Continued)

(56) References Cited

U.S. PATENT DOCUMENTS 6,128,207 A    10/2000  Lien et al.
7,495,948 B2 *  2/2009  Suzuki .................... G11C 5/14
                                                      365/154
(Continued)

OTHER PUBLICATIONS

Bankman, D., et al., "An Always-On 3.8u J/86% CIFAR-10 Mixed-Signal Binary CNN Processor With All Memory on Chip in 28-nm CMOS", In IEEE Journal of Solid-State Circuits, vol. 54, No. 1, Jan. 2019, pp. 158-172.
(Continued)

*Primary Examiner* — Son L Mai
(74) *Attorney, Agent, or Firm* — Byrne Poh LLP

(57) ABSTRACT

In some embodiments, an in-memory-computing SRAM macro based on capacitive-coupling computing (C3) (which is referred to herein as "C3SRAM") is provided. In some embodiments, a C3SRAM macro can support array-level fully parallel computation, multi-bit outputs, and configurable multi-bit inputs. The macro can include circuits embedded in bitcells and peripherals to perform hardware acceleration for neural networks with binarized weights and activations in some embodiments. In some embodiments, the macro utilizes analog-mixed-signal capacitive-coupling computing to evaluate the main computations of binary neural networks, binary-multiply-and-accumulate operations. Without needing to access the stored weights by individual row, the macro can assert all of its rows simultaneously and form an analog voltage at the read bitline node through capacitive voltage division, in some embodiments. With one analog-to-digital converter (ADC) per column, the macro cab realize fully parallel vector-matrix multiplication in a single cycle in accordance with some embodiments.

17 Claims, 16 Drawing Sheets

Related U.S. Application Data

(60) Provisional application No. 62/784,636, filed on Dec. 24, 2018.

(51) Int. Cl.
*G11C 7/10* (2006.01)
*G06F 7/544* (2006.01)
*G11C 16/34* (2006.01)

(52) U.S. Cl.
CPC .......... *G11C 7/1051* (2013.01); *G11C 7/1078* (2013.01); *G11C 15/04* (2013.01); *G11C 15/043* (2013.01); *G11C 16/3404* (2013.01)

(58) Field of Classification Search
USPC ........................................ 365/189.15, 49.11
See application file for complete search history.

(56) References Cited

U.S. PATENT DOCUMENTS

| | | | |
|---|---|---|---|
| 8,129,771 B2 | 3/2012 | Yokoyama | |
| 8,716,081 B2 | 5/2014 | Teo et al. | |
| 8,787,102 B2 | 7/2014 | Ishizu | |
| 9,001,549 B2* | 4/2015 | Onuki | G11C 5/10 365/72 |
| 9,276,091 B2 | 3/2016 | Hondo et al. | |
| 9,514,816 B1 | 12/2016 | Ashokkumar et al. | |
| 10,012,929 B2 | 7/2018 | He | |
| 10,121,533 B2* | 11/2018 | Liran | G11C 11/417 |
| 10,636,481 B1* | 4/2020 | Chang | G11C 11/419 |
| 2021/0158854 A1* | 5/2021 | Sinangil | G11C 11/4085 |

OTHER PUBLICATIONS

Biswas, A. and Chandrakasan, A.P., "Conv-RAM: An Energy-Efficient SRAM with Embedded Convolution Computation for Low-Power CNN-Based Machine Learning Applications", In Proceedings of the IEEE International Solid-State Circuits Conference, San Francisco, CA, US, Feb. 11-15, 2018, pp. 488-490.
Biswas, A. and Chandrakasan, A.P., "CONV-SRAM: An Energy-Efficient SRAM With In-Memory Dot-Product Computation for Low-Power Convolutional Neural Networks", In IEEE Journal of Solid-State Circuits, vol. 54, No. 1, Jan. 2019, pp. 217-230.
Burr, G.W., et al., "Experimental Demonstration and Tolerancing of a Large-Scale Neural Network (165,000 Synapses) Using Phase-Change Memory as the Synaptic Weight Element", In IEEE Transactions on Electron Devices, vol. 62, No. 11, Nov. 2015, pp. 3498-3507.
Chen, A. and Lin, M.R., "Variability of Resistive Switching Memories and Its Impact on Crossbar Array Performance", In Proceedings of the International Reliability Physics Symposium, Monterey, CA, US, Apr. 10-14, 2011, pp. 1-4.
Chen, W.H., et al., "A 65nm 1Mb Nonvolatile Computing-in-Memory ReRAM Macro with Sub-16ns Multiply-and-Accumulate for Binary DNN AI Edge Processors", In Proc. of the IEEE Intl. Solid-State Circuits Conf., San Francisco, CA, US, Feb. 11-15, 2018, pp. 1-3.
Chen, Y.H., et al., "Eyeriss: An Energy-Efficient Reconfigurable Accelerator for Deep Convolutional Neural Networks", In IEEE Journal of Solid-State Circuits, vol. 52, No. 1, Jan. 2017, pp. 127-138.
Chi, P., et al., "PRIME: A Novel Processing-in-Memory Architecture for Neural Network Computation in ReRAM-Based Main Memory", In ACM SIGARCH Computer Architecture News, vol. 44, No. 3, Jun. 2016, pp. 27-39.
Courbariaux, M., et al., "BinaryConnect: Training Deep Neural Networks with Binary Weights During Propagations", In Advances in Neural Information and Processing Systems (NIPS), vol. 28, Nov. 2, 2015, pp. 3123-3131.

Dong, Q., et al., "A 0.3V VDDmin 4+2T Sram for Searching and In-Memory Computing Using 55nm DDC Technology", In Proceedings of the Symposium on VLSI Circuits, Kyoto, JP, Jun. 5-8, 2017, pp. 1-2.
Eckert, C., et al., "Neural Cache: Bit-Serial In-Cache Acceleration of Deep Neural Networks", In Proceedings of the 45th Annual International Symposium on Computer Architecture, Los Angeles, Ca, US, Jun. 1-6, 2018, pp. 1-14.
Gokmen, T. and Vlasov, Y., "Acceleration of Deep Neural Network Training with Resistive Cross-Point Devices: Design Considerations", In Front. Neurosci., vol. 10, Jul. 21, 2016, pp. 1-13.
Gonugondla, S.K., et al., "A 42pJ/Decision 3.12TOPS/W Robust In-Memory Machine Learning Classifier with On-Chip Training", In Proceedings of the IEEE International Solid-State Circuits Conference, San Francisco, CA, US, Feb. 10-15, 2018, pp. 1-13.
Gonugondla, S.K., et al., "A Variation-Tolerant In-Memory Machine Learning Classifier via On-Chip Training", In IEEE Journal of Solid-State Circuits, vol. 53, No. 11, Nov. 2018, pp. 3163-3173.
Guan, T., et al., "Recursive Binary Neural Network Learning Model with 2.28b/Weight Storage Requirement", Technical Report, arXiv:1709.05306, Cornell University, Sep. 15, 2017, pp. 1-10.
Gupta, A., et al., "Deep Learning with Limited Numerical Precision", In Proceedings of the 32nd International Conference on Machine Learning (ICML), Lille, FR, Jul. 7-9, 2015, pp. 1-10.
Gupta, N., et al., "Tunnel FET based ultra-low-leakage compact 2T1C SRAM", In Proceedings of the 18th International Symposium on Quality Electronic Design, Santa Clara, CA, US, Mar. 14-15, 2017, pp. 1-5.
He, K., et al., "Deep Residual Learning for Image Recognition", In Proceedings of the IEEE Conference on Computer Vision and Pattern Recognition (CVPR), Las Vegas, NV, US, Jun. 27-30, 2016, pp. 1-9.
Hubara, I., et al., "Quantized Neural Networks: Training Neural Networks with Low Precision Weights and Activations", Technical Report, arXiv:1609.07061, Cornell University, Sep. 22, 2016, pp. 1-29.
Hubara, J., et al., "Binarized Neural Networks: Training Neural Networks with Weights and Activations Constrained to +1 or −1", In Advances in Neural Information Processing Systems (NIPS), vol. 29, Mar. 2016, pp. 4107-4115.
International Preliminary Report on Patentability dated Jul. 8, 2021 in International Patent Application No. PCT/US2019/068495, pp. 1-16.
International Search Report and Written Opinion dated Mar. 25, 2020 in International Patent Application No. PCT/US2019/068495, pp. 1-16.
Ioffe, S. and Szegedy, C., "Batch Normalization: Accelerating Deep Network Training by Reducing Internal Covariate Shift", In Proceedings of the 32nd International Conference on Machine Learning (ICML), Lille, FR, Jul. 7-9, 2015, pp. 1-9.
Jiang, Z., et al., "C3SRAM: In-Memory-Computing SRAM Macro Based on Capacitive-Coupling Computing", In IEEE Solid-State Circuits Letters, vol. 2, No. 9, Sep. 2019, pp. 131-134.
Kang, M., et al., "A 19.4 nJ/Decision 364K Decisions/s In-Memory Random Forest Classifier in 6T SRAM Array", In Proceedings of the 43rd IEEE European Solid State Circuits Conference, Leuven, BE, Sep. 11-14, 2017, pp. 1-5.
Kang, M., et al., "An In-Memory VLSI Architecture for Convolutional Neural Networks", In IEEE Journal on Emerging and Selected Topics in Circuits and Systems, vol. 8, No. 3, Sep. 2018, pp. 494-505.
Khwa, W.S., et al., "A 65nm 4Kb algorithm-dependent computing-in-memory SRAM unit-macro with 2.3ns and 55.8TOPS/W fully parallel product-sum operation for binary DNN edge processors", In Proc. of the IEEE Intl. Solid-State Circuits Conf., San Francisco, CA, US, Feb. 11-15, 2018, pp. 1-3.
Kim, S., et al., "NVM Neuromorphic Core with 64k-Cell (256-by-256) Phase Change Memory Synaptic Array with On-Chip Neuron Circuits for Continuous In-Situ Learning", In Proc. of the IEEE Intl. Electron Devices Meeting, Washington, DC, US, Dec. 7-9, 2015, pp. 1-4.
Kobayashi, M., et al., "A Nonvolatile SRAM Integrated with Ferroelectric HfO2 Capacitor for Normally-Off and Ultralow Power

(56) References Cited

OTHER PUBLICATIONS

IoT Application", In Proceedings of the Symposium on VLSI Technology, Kyoto, JP, Jun. 5-8, 2017, pp. 1-2.
Krizhevsky, A., et al., "ImageNet classification with deep convolutional neural networks", In Advances in Neural Information and Processing Systems, vol. 25, Jan. 2012, pp. 1097-1105.
Lin, X., et al., "Towards Accurate Binary Convolutional Neural Network", Technical Report, arXiv:1711.11294, Cornell University, Nov. 30, 2017, pp. 1-14.
Merolla, P.A., et al., "A Million Spiking-Neuron Integrated Circuit with a Scalable Communication Network and Interface", In Science, vol. 345, No. 6197, Aug. 8, 2014, pp. 668-673.
Moons, B., et al., "14.5 Envision: A0.26-to-10TOPS/W Wubword-Parallel Dynamic-Voltage-Accuracy-Frequency-Scalable Convolutional Neural Network Processor in 28nm FDSOI", In Proc. of the IEEE Intl. Solid-State Circuits Conf., San Francisco, CA, US, Feb. 5-9, 2017, pp. 1-4.
Parveen, F., et al., "HieIM: Highly Flexible In-Memory Computing Using STT MRAM", In Proceedings of the 23rd Asia and South Pacific Design Automation Conference, Jeju, KR, Jan. 22-25, 2018, pp. 1-6.
Rastegari, M., et al., "XNOR-Net: ImageNet Classification Using Binary Convolutional Neural Networks", In Proceedings of the 14th European Conference on Computer Vision, Amsterdam, NL, Oct. 11-14, 2016, pp. 1-18.
Shin, D., et al., "14.2 DNPU: An 8.1TOPS/W Reconfigurable CNN-RNN Processor for General-Purpose Deep Neural Networks", In Proceedings of the IEEE International Solid-State Circuits Conference, San Francisco, CA, US, Feb. 5-9, 2017, pp. 1-3.
Si, X., et al., "24.5 A Twin-8T SRAM Computation-In-Memory Macro for Multiple-Bit CNN-Based Machine Learning", In Proceedings of the IEEE International Solid-State Circuits Conference, San Francisco, CA, US, Feb. 17-21, 2019, pp. 1-3.
Si, X., et al., "A Dual-Split 6T SRAM-Based Computing-in-Memory Unit-Macro With Fully Parallel Product-Sum Operation for Binarized DNN Edge Processors", In IEEE Transactions on Circuits and Systems I: Regular Papers, vol. 66, No. 11, Nov. 2019, pp. 4172-4185.
Simonyan, K. and Zisserman, A., "Very Deep Convolutional Networks for Large-Scale Image Recognition", Technical Report, arXiv: 1409.1556, Cornell University, Apr. 10, 2015, pp. 1-14.
Sinangil, M.E., et al., "A 28 nm 2 Mbit 6 T Sram With Highly Configurable Low-Voltage Write-Ability Assist Implementation and Capacitor-Based Sense-Amplifier Input Offset Compensation", In IEEE Journal of Solid-State Circuits, vol. 51, No. 2, Feb. 2016, pp. 557-567.
Szegedy, C., et al., "Going Deeper With Convolutions", In Proceedings of the IEEE Conference on Computer Vision and Pattern Recognition (CVPR), Boston, MA, US, Jun. 7-12, 2015, pp. 1-9.
Valavi, H., et al., "A 64-Tile 2.4-Mb In-Memory-Computing CNN Accelerator Employing Charge-Domain Compute", In IEEE Journal of Solid-State Circuits, vol. 54, No. 6, Jun. 2019, pp. 1789-1799.
Valavi, H., et al., "A Mixed-Signal Binarized Convolutional-Neural-Network Accelerator Integrating Dense Weight Storage and Multiplication for Reduced Data Movement", In Proc. of the Symposium on VLSI Circuits, Honolulu, HI, US, Jun. 18-22, 2018, pp. 141-142.
Verma, N., et al., "In-Memory Computing: Advances and Prospects", In IEEE Solid-State Circuits Conference, vol. 11, No. 3, Aug. 23, 2019, pp. 43-55.
Wang, J., et al., "14.2 A Compute SRAM with Bit-Serial Integer/Floating-Point Operations for Programmable In-Memory Vector Acceleration", In Proc. of the IEEE Intl. Solid-State Circuits Conf., San Francisco, CA, US, Feb. 17-21, 2019, pp. 1-3.
Wang, J., et al., "cNV SRAM: CMOS Technology Compatible Non-Volatile SRAM Based Ultra-Low Leakage Energy Hybrid Memory System", In IEEE Transactions on Computers, vol. 65, No. 4, Apr. 1, 2016, pp. 1055-1067.
Whatmough, P.N., et al., "14.3 A 28nm SoC with a 1.2GHz 568nJ/Prediction Sparse Deep-Neural-Network Engine with >0.1 Timing Error Rate Tolerance for IoT Applications", In Proc, of the IEEE Intl. Solid-State Circuits Conf., San Francisco, CA, US, Feb. 5-9, 2017, pp. 1-3.
Yin, S., et al., "Vesti: Energy-Efficient In-Memory Computing Accelerator for Deep Neural Networks", In IEEE Transactions on Very Large Scale Integration Systems, vol. 28, No. 1, Jan. 2020, pp. 48-61.
Yin, S., et al., "XNOR-SRAM: In-Memory Computing SRAM Macro for Binary/Ternary Deep Neural Networks", In IEEE Journal of Solid-State Circuits, vol. 55, No. 6, Jun. 2020, pp. 1733-1743.
Zabihi, M., et al., "In-Memory Processing on the Spintronic CRAM: From Hardware Design to Application Mapping", In IEEE Transactions on Computers, vol. 68, No. 8, Aug. 1, 2019, pp. 1159-1173.
Zhang, J., et al., "In-Memory Computation of a Machine-Learning Classifier in a Standard 6T SRAM Array", In IEEE Journal of Solid-State Circuits, vol. 52, No. 4, Apr. 2017, pp. 915-924.
Zhou, S., et al., "DoReFa-Net: Training Low Bitwidth Convolutional Neural Networks with Low Bitwidth Gradients", Technical Report, arXiv: 1606.06160, Cornell University, Jun. 20, 2016, pp. 1-13.
Zimmer, B., et al., "A RISC-V vector processor with tightly-integrated switched-capacitor DC-DC converters in 28nm FDSOI", In Proceedings of the Symposium on VLSI Circuits, Kyoto, JP, Jun. 17-19, 2015, pp. 1-2.

* cited by examiner

| Weight | | Input | | | | |
|---|---|---|---|---|---|---|
| Q / QB | MWL / MWLB | | +1 | −1 | 0 | Reset |
| | MWL | | $V_{DR}$ | 0 | $V_{RST}$ | $V_{RST}$ |
| | MWLB | | 0 | $V_{DR}$ | $V_{RST}$ | $V_{RST}$ |
| +1 | | $V_{CORE}$ | 0 | $V_{DR}$ | $\underline{V_{RST}}$ | $\underline{V_{RST}}$ |
| −1 | | 0 | $V_{CORE}$ | $\underline{0}$ | $V_{DR}$ | $\underline{V_{RST}}$ | $\underline{V_{RST}}$ |

Vc denoted with underlining

FIG. 2E

# CIRCUITS AND METHODS FOR IN-MEMORY COMPUTING

CROSS REFERENCE TO RELATED APPLICATION

This application is a continuation of International Patent Application No. PCT/US2019/068495, filed Dec. 24, 2019, which claims the benefit of U.S. Provisional Patent Application No. 62/784,636, filed Dec. 24, 2018, each of which is hereby incorporated by reference herein in its entirety.

STATEMENT REGARDING GOVERNMENT FUNDED RESEARCH

This invention was made with government support under 1652866 awarded by the National Science Foundation. The Government has certain rights in this invention.

BACKGROUND

Deep learning tasks in edge computing are becoming ever more prevalent as their application is driven by the massive growth in the Internet-of-Thing paradigm. This has motivated research into low-energy hardware architectures for deep neural networks (DNN).

Recent research has investigated low precision and even binary representations of weights and activations, which allow each weight of a DNN to be mapped to one static random-access memory (SRAM) bitcell. Conventional SRAM architectures, however, still require millions or even billions of row-by-row memory accesses for DNNs, limiting improvements in energy-efficiency. To address this, recent research has demonstrated SRAM-based in-memory computing, which performs embedded multiply-and-accumulate (MAC) computation inside an SRAM without the need for explicit memory access. However, known mechanisms for SRAM-based in-memory computing are deficient in many ways.

Accordingly, it is desirable to provide new circuits and methods for in-memory computing.

SUMMARY

In accordance with some embodiments, circuits and methods for in-memory computing are provided. In some embodiments, circuits for a bitcell are provided, the circuits comprising: a first switch having a first side, a second side, and a control input wherein the first side of the first switch is connected to a first supply voltage; a second switch having a first side, a second side, and a control input wherein the control input of the second switch is connected to the second side of the first switch, and the second side of the second switch is connected to the control input of the first switch; a third switch having a first side, a second side, and a control input wherein the first side of the third switch is connected to the second side of the first switch, the second side of the third switch is connected to a second supply voltage, and the control input of the third switch is connected to the control input of the first switch; a fourth switch having a first side, a second side, and a control input wherein the first side of the fourth switch is connected to the second side of the second switch, the second side of the fourth switch is connected to the second supply voltage, and the control input of the fourth switch is connected to the control input of the second switch; a fifth switch having a first side, a second side, and a control input wherein the first side of the fifth switch is connected to the second side of the first switch; a sixth switch having a first side, a second side, and a control input wherein the first side of the sixth switch is connected to the second side of the second switch; a seventh switch having a first side, a second side, and a control input wherein the control input of the seventh switch is connected to the second side of the first switch; an eighth switch having a first side, a second side, and a control input wherein the control input of the eighth switch is connected to the second side of the second switch; and a capacitor having a first side and a second side wherein the first side of the capacitor is connected to the first side of the seventh switch and the first side of the eighth switch.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

FIG. 2E is an example of a table showing different voltage levels in a C3SRAM macro for different inputs/activations and weights in accordance with some embodiments.

DETAILED DESCRIPTION

In accordance with some embodiments, circuits and methods for in-memory computing are provided.

In some embodiments, an in-memory-computing SRAM macro based on capacitive-coupling computing (C3) (which is referred to herein as "C3SRAM") is provided. In some embodiments, a C3SRAM can support array-level fully parallel computation, multi-bit outputs, and configurable multi-bit inputs.

In some embodiments, the macro is of an SRAM module with circuits embedded in bitcells and peripherals to perform hardware acceleration for neural networks with binarized weights and activations. In some embodiments, the macro utilizes analog-mixed-signal capacitive-coupling computing to evaluate the main computations of binary neural networks, binary-multiply-and-accumulate operations. Without needing to access the stored weights by individual row, the macro can assert all of its rows simultaneously and form an analog voltage at the read bitline node through capacitive voltage division, in some embodiments. With one analog-to-digital converter (ADC) per column, the macro realizes fully parallel vector-matrix multiplication in a single cycle in accordance with some embodiments.

In some embodiments, multi-bit inputs/activations can be used improve convolutional neural network (CNN) and/or DNN accuracies over binary activations, especially for large datasets. In some embodiments, two to four-bit inputs can achieve competent accuracy in target inference tasks. In some embodiments, the input can be configurable to have a bitwidth between 1 and 4 bits. In some embodiments, multi-bit inputs can be processed across multiple cycles from LSB to MSB, where each cycle's digital MAC result is halved (right shifted) and accumulated to the next cycle's output.

Figure 1:
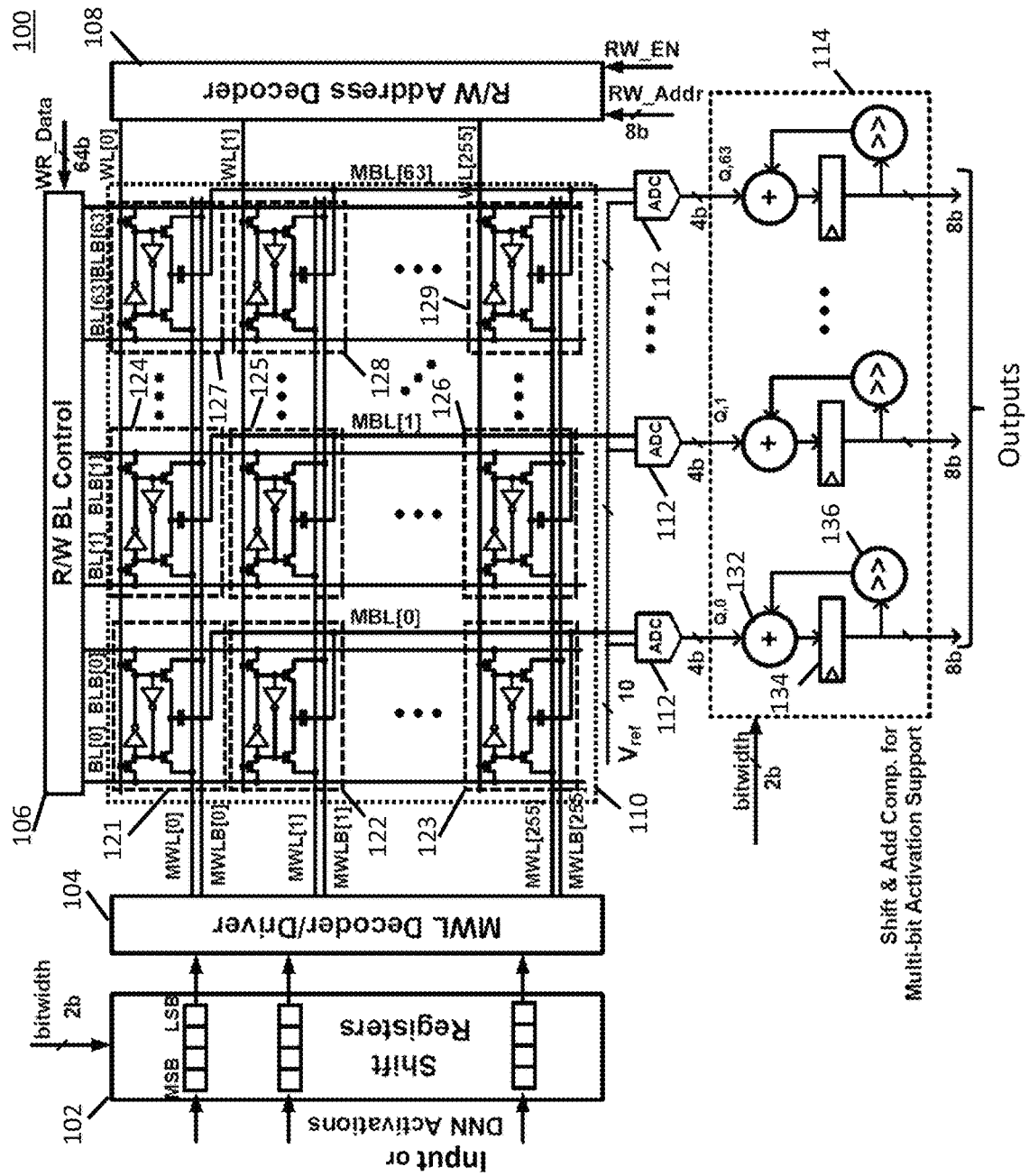
FIG. 1 is an example of a schematic diagram of a C3SRAM macro in accordance with some embodiments.

FIG. 1 illustrates an example architecture 100 of a 256×64 C3SRAM macro in accordance with some embodiments. As shown, architecture 100 includes shift registers 102, MAC wordline decoder/driver 104, read/write (R/W) bitline (BL) control 106, R/W address decoder 108, array 110, analog-to-digital converters (ADCs) 112, and shift-and-add components 114.

Shift registers 102 can be any suitable shift registers (e.g., having any suitable number of bits) and any suitable number of shift registers can be included in shift registers 102. For example, in some embodiments, shift register 102 can include 256 configurable four-bit shift registers. Each of these shift registers can be configured to provide an output for a corresponding row of array 110. The configuration of the shift registers can be controlled by the two-bit (when using a four-bit shift register) bitwidth signal received at the top of shift registers 102. The bitwidth signal can determine whether the shift register receives one, two, three, or four bits for each input or activation signal received at the left of shift registers.

MAC wordline (MWL) decoder/driver 104 can be any suitable circuit for driving MWL and MWL bar (MWLB) lines of array 110 as described further in connection with FIGS. 2A-2E below in some embodiments. For each cycle of the C3SRAM macro (as described in FIGS. 2A-2E below), MWL decoder/driver 104 receives one bit for each row of array 110 from a corresponding shift register of shift registers 102. In some embodiments, the ports of MAC wordlines (MWL and MWLB) of the bitcell can be capacitive and therefore small MWL drivers can drive all of the bitcells in a row of array 110.

In some embodiments, in order to improve accuracies of a C3SRAM macro, MWL decoder/driver 104 can have a maximum drive voltage $V_{DR}$ that is 200 mV (or any other suitable value (e.g., 150 mV, 250 mV, etc.)) lower than the core voltage ($V_{CORE}$) which is used as the maximum drive voltage of R/W BL control 106 and R/W address decoder 108. Thus, in some embodiments, when $V_{CORE}$ is equal to 1.0 VDC, $V_{DR}$ is equal to 0.8 VDC.

In some embodiments, MWL decoder/driver 104 can drive MWL and MWLB lines with binary values (e.g., 0 VDC and 0.8 VDC). In some embodiments, MWL decoder/driver 104 can drive MWL and MWLB lines with any other suitable type of value, such as ternary values (e.g., 0 VDC, 0.4 VDC, and 0.8 VDC).

The multi-bit input/activations received by shift registers 102 can be in the two's-complement format in some embodiments. In such instances, MWL decoder/driver 104 can produce the voltage ramping combination for −1 or 0 for the MSB cycle and +1 or 0 for all other cycles in some embodiments.

R/W BL control 106 can be any suitable read/write control circuit (as known in the art) as used in an SRAM in some embodiments. R/W BL control 106 can receive any suitable signal (such a WR_Data (64 bits)) for controlling the bitlines (BL[0]-BL[64]) as shown in FIG. 1.

R/W address decoder 108 can be any suitable read/write address decoder (as known in the art) as used in a SRAM in some embodiments. R/W address decoder 108 can receive any suitable signals (such as RW_EN and RW_Addr (8 bits)) for decoding addresses on the wordlines (WL[0]-WL[255]) as shown in FIG. 1.

Array 110 can be an array of bitcells, such as bitcells 121-129. Any suitable number of bitcells can be included in array 110, and each bitcell can have any suitable architecture, in some embodiments. For example, as illustrated in FIG. 1, array 110 can include 256×64 (256 rows by 64 columns) bitcells, though any suitable number of rows and columns can be used in some embodiments, and each bitcell can have the architecture described in connection with, and illustrated in, FIG. 2A. Each bitcell can store one binary weight in some embodiments. These binary weights can be used to convolve the values received on the MWL and MWLB lines (MWL[0], MWLB[0]; MWL[1], MWLB[1]; . . . ; MWL[255], MWLB[255]) output by MWL decoder/driver 104.

ADCs 112 can be any suitable analog-to-digital converters in some embodiments, and any suitable number of ADCs 112 can be used. For example, as illustrated in FIG. 1, an ADC 112 can be provided for each column of array 110 in some embodiments. In some embodiments, ADCs 112 can be implemented with flash analog-to-digital converters that are each pitch-matched to a bitcell. In some embodiments, the ADCs can have any suitable number of levels and any suitable voltage resolution.

As shown in FIG. 1, the ADCs can receive as input the voltage levels on the MAC bitlines (e.g., MBL[0]-MBL[63]).

During operation, the ADCs can convert analog values of the dot-product of inputs/activations and weights to the digital counterparts for other DNN computations such as non-linear activations, max-pooling, etc.

Shift-and-add components 114 can be any suitable shift-and-add components in some embodiments, and any suitable number of shift-and-add components can be used in some embodiments. For example, as shown in FIG. 1, one shift-and-add component can be provided for each column, and each shift-and-add component can include an adder 132, a register 134, and a shifter 136 so that the adder can add the output of an ADC 112 to the output of the shifter, and that output can then be stored in the register. The bitwidth (e.g., 2 bits) signal received at the left side of shift-and-add components 114 can control register 134 so that it is cleared upon initialization and after the number of bits in the input or DNN activations are processed. Thus, shift-and-add components 114 can receive and accumulate the ADC outputs over multiple cycles in some embodiments.

The outputs at the bottom of shift-and-add components 114 can be the outputs for a layer of a DNN, which can then be fed back into a new layer of a DNN, or can be the outputs for the entire DNN, depending on the implementation used, in some embodiments.

In some embodiments, it may be desirable to further combine the analog signals on the MLB lines before converting the signals from the analog domain to the digital domain. In such cases, any suitable analog connections (including simple wires, analog multiplexers, analog switches, etc.) can be provided between the MLB lines.

Figure 2A:
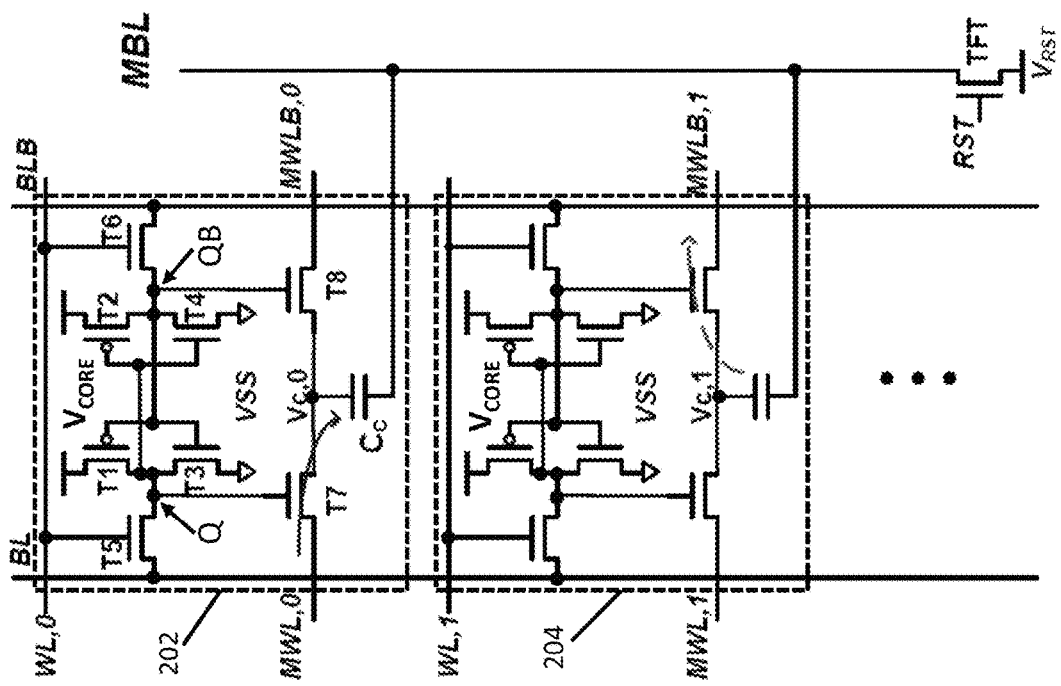
FIG. 2A is an example of a schematic diagram of two bitcells in accordance with some embodiments.

As shown in FIG. 2A in accordance with some embodiments, a bitcell in array 110 (such as one or more of bitcells 121-129) can be formed from eight transistors (T1-T8) and one capacitor ($C_C$) as shown in each of bitcells 202 and 204 of FIG. 2. The transistors can be implemented using any suitable transistors, such as PMOS transistors (e.g., transistors T1 and T2) and NMOS transistors (e.g., transistors T3-T8) in some embodiments. The capacitors can be implemented using any suitable capacitor technology (e.g., using nmoscap or any other suitable technology) and have any suitable size (e.g., 3.88 fF) in some embodiments.

The bitcells can compute bitwise XNORs of the values on the MAC wordlines (MWL[0], MWLB[0]; . . . ; MWL[255], MWLB[255]) and bitlines (BL[0]-BL[63]) using capacitive coupling as a computation mechanism in some embodiments.

In accordance with some embodiments, the steps for in-bitcell computation at a bitcell that are performed during a cycle of the C3SRAM can be as follows.

Figure 2B:
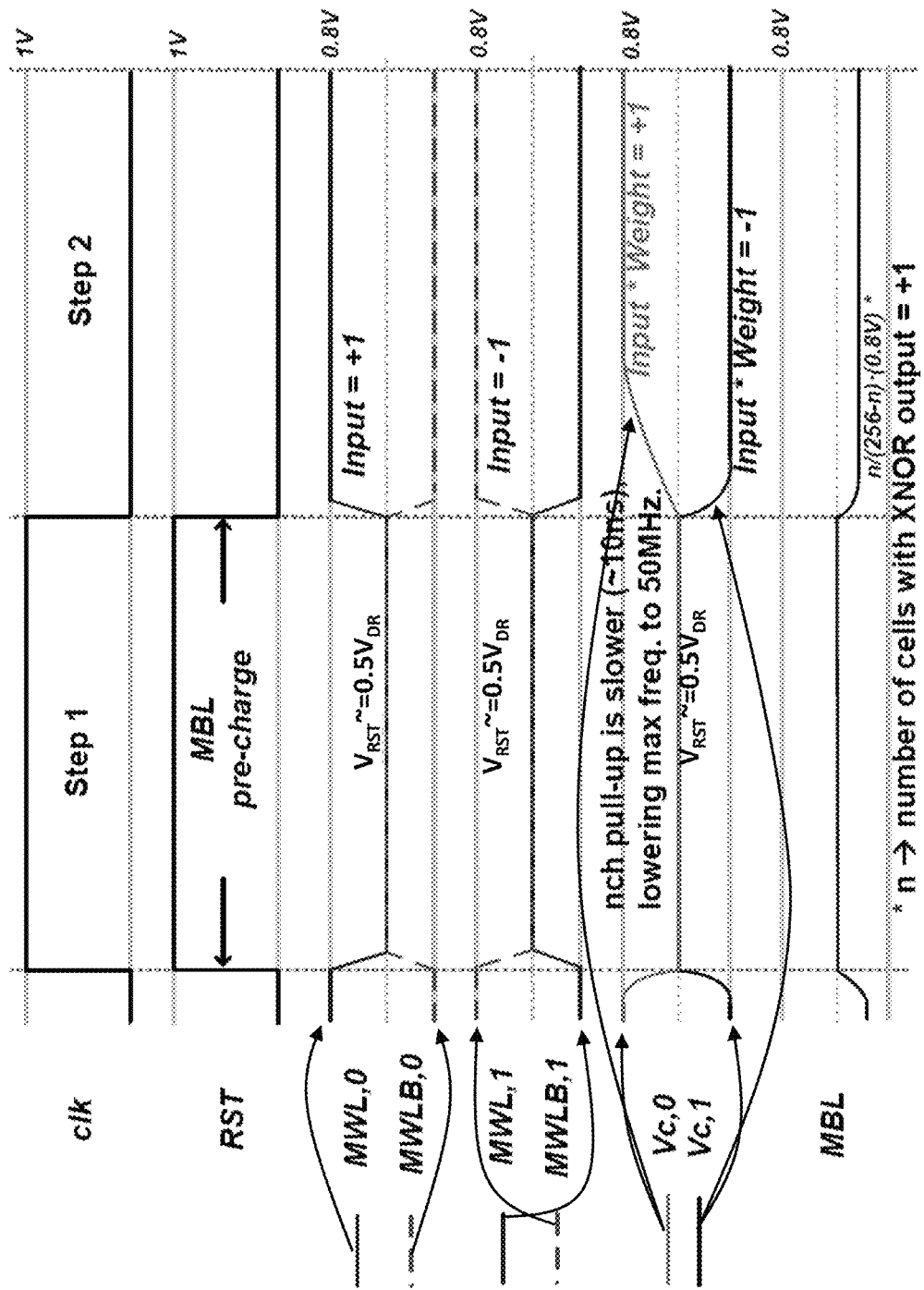
FIG. 2B is an example of a timing diagram showing the operation of a bitcell in accordance with some embodiments.
Figure 2C:
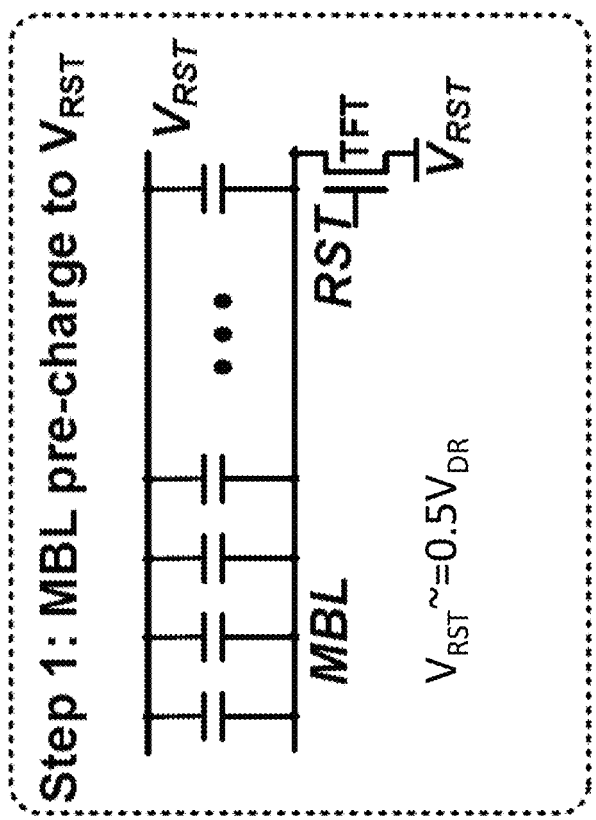
FIG. 2C is an example of a schematic diagram showing the operation of a bitcell during a first step in accordance with some embodiments.

First, as shown by the left column in FIG. 2B, the voltage across capacitor $C_C$ in the bitcell can be initialized (e.g., to ~0 VDC) by driving the MAC bitline (MBL) to $V_{RST}$ (~0.5·$V_{DR}$) using footer transistor TFT and by driving MWL and MWLB to $V_{RST}$ using MWL decoder/driver 104. At this point, the capacitors of the bitcells are effectively arranged as shown in FIG. 2C. That is, all of the capacitors are arranged in parallel between voltages equal to $V_{RST}$.

Figure 2D:
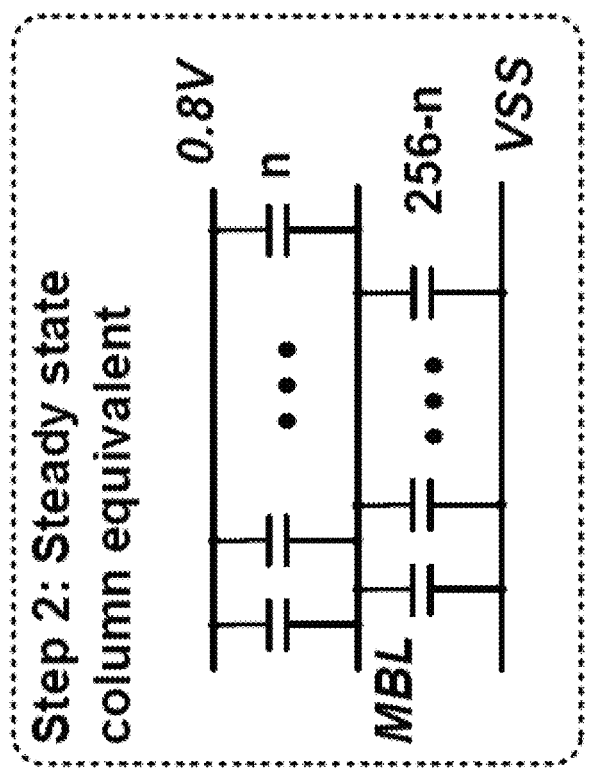
FIG. 2D is an example of a schematic diagram showing the operation of a bitcell during a second step in accordance with some embodiments.

Second, following this reset phase, as shown in the right column of FIG. 2B, the MBL is allowed to float by turning off the TFT. For each input/activation bit (e.g., 256 bits as shown in FIG. 1) from a corresponding shift register of shift registers 102, an input of either +1, 0, or −1 can then be applied as follows. For the input of +1, MWL decoder/driver 104 drives the MWL from $V_{RST}$ to $V_{DR}$ while the MWLB is driven from $V_{RST}$ to VSS. For the input of −1, MWL decoder/driver 104 drives the MWL from $V_{RST}$ to VSS while the MWLB is driven from $V_{RST}$ to $V_{DR}$. For the input of 0, both MWL and MWLB are held at $V_{RST}$. When the weight is +1, the voltage ramping via T7 induces a displacement current $I_C$ through capacitor $C_C$ in the bitcell, whose magnitude is:

$I_C = C_C \cdot dV_{MWL}/dt$, where $V_{MWL}$ is the voltage of MWL, and t is time. If the weight is −1, the voltage ramping via T8 induces a displacement current $I_C$ through capacitor $C_C$ in the bitcell, whose magnitude is also:

$I_C = C_C \cdot dV_{MWLB}/dt$, where $V_{MWLB}$ is the voltage of MWL, and t is time. The amount of the charge transferred from the bitcell to MBL is then formulated as:

$Q_{Ci} = \int_0^{t_1} I_C \cdot dt = 0.5 \cdot C_C \cdot V_{DR}$, where $t_1$ is the time it takes $V_{MWL}$ to reach $V_{DR}$. The shared MBL potential for each column containing 256 bitcells is set to:

$V_{MBL} = C_C \cdot V_{DR} \cdot \Sigma_1^{256}(XNOR_i)/(256 \cdot C_C + C_p)$, where XNORi is the XNOR output of the i-th bitcell output and the value encoded in MWL/MWLB, and Cp is the parasitic capacitance of MBL plus the input capacitance of the ADC at the bottom of the column. At this point, the capacitors of the bitcells are effectively arranged as shown in FIG. 2D. That is, n of the capacitors are arranged in parallel between $V_{DR}$ and MBL and 256-n of the capacitor are arranged in parallel between MBL and VSS. In this arrangement, the capacitors form a capacitive voltage divider.

FIG. 2E summarizes values at different points in FIG. 2A for different inputs/activations and weights in accordance with some embodiments. As shown, when a bitcell is resetting or when the input is 0, MWL, MWLB and the voltage at node $V_C$ (the top side of the capacitor in the bitcell) are all equal to $V_{RST}$. When the input/activation is +1: the MWL is $V_{DR}$; the MWLB is 0 VDC; and $V_C$ is $V_{DR}$ when the weight is +1 and $V_C$ is 0 VDC when the weight is −1. When the input/activation is −1: the MWL is 0 VDC; the MWLB is $V_{DR}$; and $V_C$ is 0 VDC when the weight is +1 and $V_C$ is $V_{DR}$ when the weight is −1. When the weight is +1, Q is $V_{CORE}$ and QB is 0 VDC. When the weight is −1, Q is 0 VDC and QB is $V_{CORE}$.

Figure 3A:
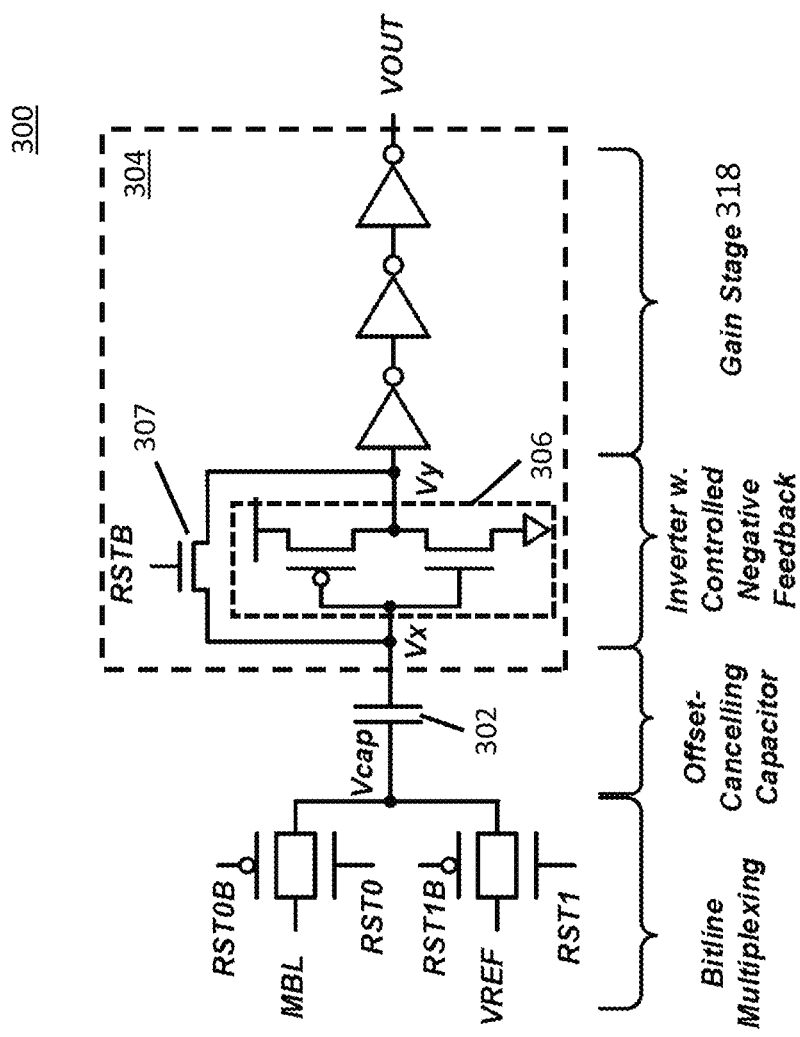
FIG. 3A is an example of a schematic diagram of a portion of an analog-to-digital converter that can be used with a C3SRAM macro in accordance with some embodiments.

Turning to FIG. 3A-3D, details of some analog-to-digital converters that can be used as ADCs 112 in some embodiments are provided. In some embodiments, each ADC can include ten double-sampling based self-calibrating single-ended comparators 300 as shown in FIG. 3A. Each comparator 300 can include an offset-cancelling capacitor 302 followed by an inverter chain 304, where the first inverter 306 acts as an amplifier and a controlled negative feedback circuit 307 is provided, in some embodiments.

In some embodiments, the ADCs can operate as follows.

Figure 3B:
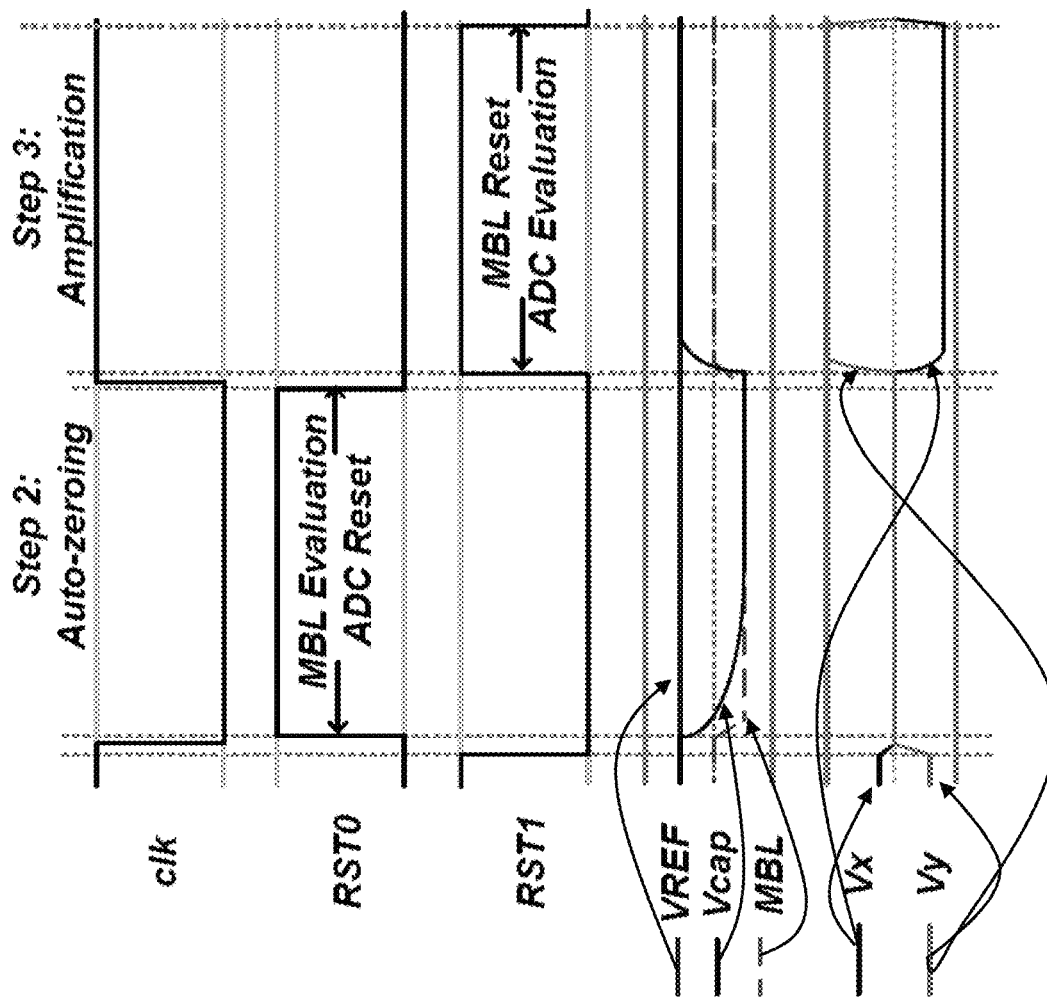
FIG. 3B is an example of a timing diagram showing the operation of a portion of an analog-to-digital converter that can be used with a C3SRAM macro in accordance with some embodiments.
Figure 3C:
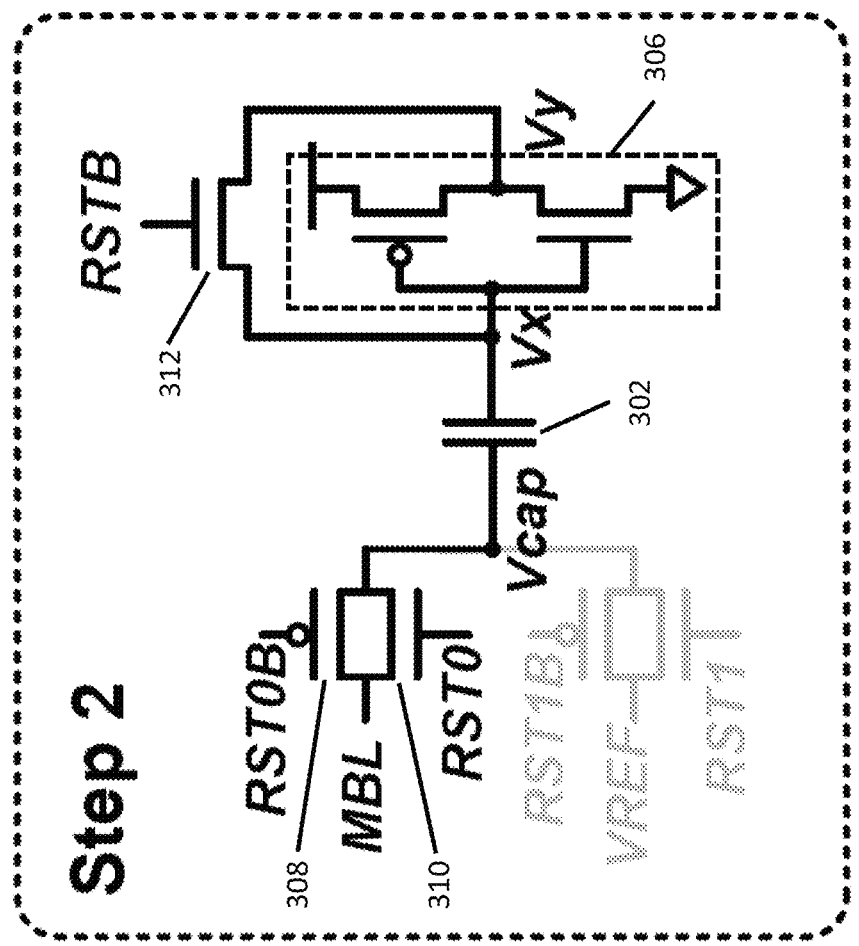
FIG. 3C is an example of a schematic diagram showing the operation of a portion of an analog-to-digital converter that can be used with a C3SRAM macro during a second step in accordance with some embodiments.

First, as shown in the left column of FIG. 3B and in FIG. 3C, during step 2: MBL connects to the left side of the capacitor 302 via transistors 308 and 310 based on signals RST0 and RST0B; and transistor 312 connects $V_X$ to $V_Y$ based on signal RSTB (which is the opposite (bar) of RST of FIG. 2B), which places first inverter 306 in a high gain region.

Figure 3D:
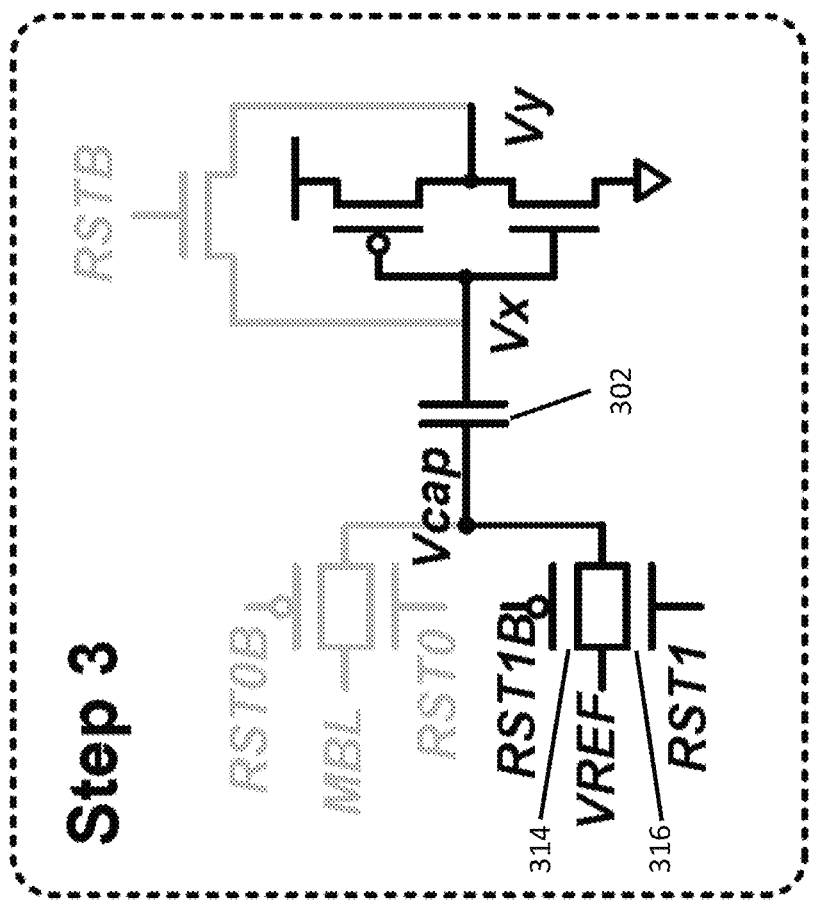
FIG. 3D is an example of a schematic diagram showing the operation of a portion of an analog-to-digital converter that can be used with a C3SRAM macro during a third step in accordance with some embodiments.

Second, as shown in the right column of FIG. 3B and in FIG. 3D, during step 3: the left side of capacitor 302 is then connected to the reference voltage (VREF) by transistors 314 and 316 based on signals RST1 and RST1B; and transistor 312 disconnects $V_X$ from $V_Y$ based on signal RSTB (which is the opposite (bar) of RST of FIG. 2B). The voltage differential between $V_{MBL}$ and VREF then causes charging or discharging on capacitor 302 (based on the differential), which in turn tips the inverter chain toward VDD or VSS. The gain-stage 318 of the inverter chain completes the amplification to the digital domain.

In the aforementioned three-step procedure, relevant signal transitions in step 1 (left side of FIG. 2B and FIG. 2C) and step 3 (right side of FIG. 3B and FIG. 3D) are decoupled in separate modules, meaning that while the digital output is being evaluated by the ADC, the memory array can begin computing the next batch of binary multiply and accumulate (bMAC) operations, in some embodiments. This allows a pipeline of a half-cycle in which step 1 and step 3 operate concurrently in some embodiments.

Figure 4:
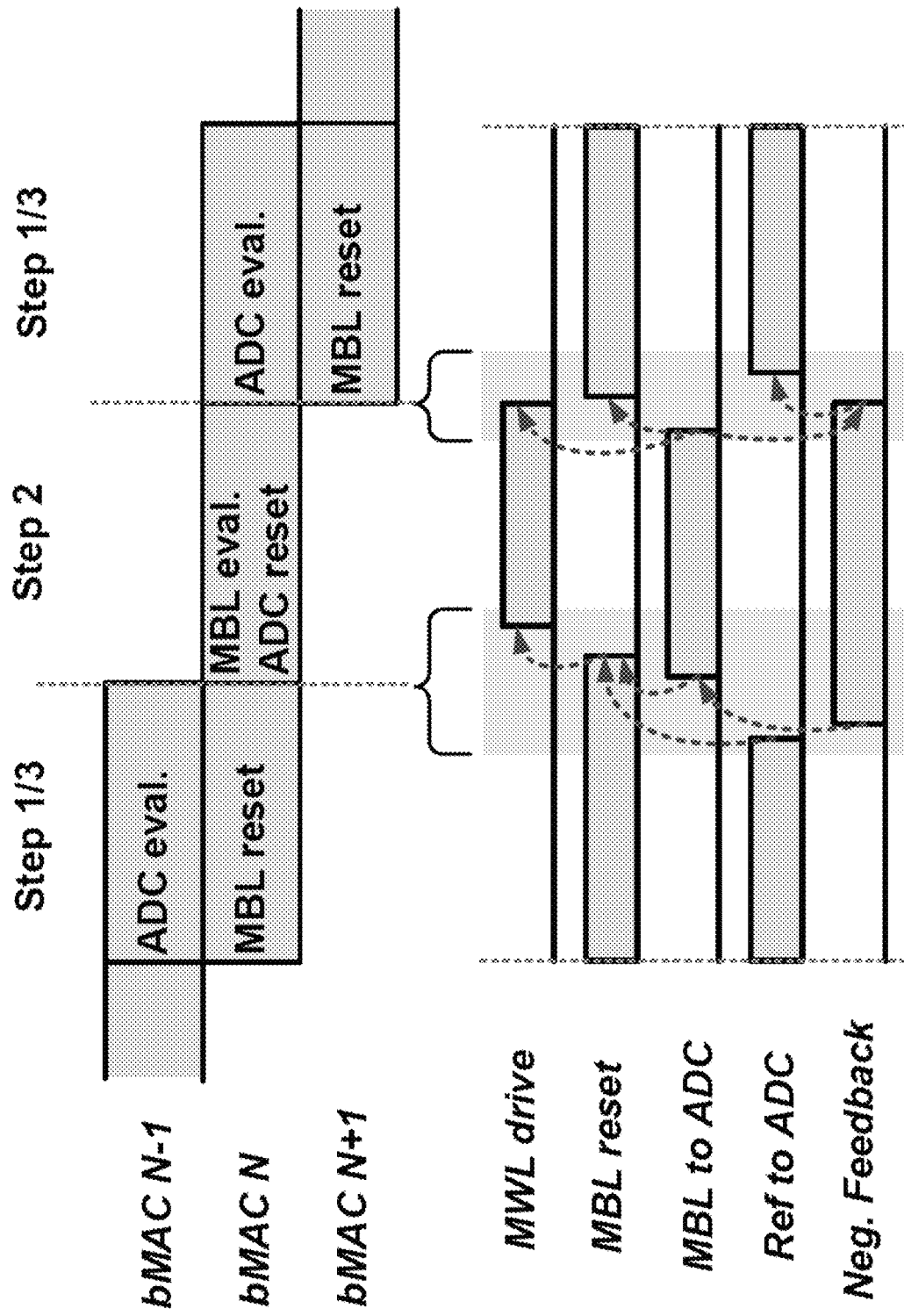
FIG. 4 is an example of a timing diagram showing relative timing of different signals during the operation a C3SRAM macro in accordance with some embodiments.

In some embodiments, the bMAC operation is timing sensitive. To minimize analog non-idealities, concurrent signal switches described above can be controlled to follow the order shown in FIG. 4. As shown, transitions from steps 1 and 3 to step 2 can follow this order: 1) the reference voltage is disconnected from capacitor 302 before MBL leaves reset; 2) the negative feedback on the inverter stage is turned on before MBL is connected to capacitor 302; 3) MBL is connected to capacitor 302 before MBL leaves reset; and 4) MWL is not driven until MBL is floating.

As also shown, the transitions from step 2 to step 1 and 3 can follow this order: 1) MBL is disconnected from capacitor 302 before MWL drivers switch to reset voltage; 2) also, MBL is disconnected before MBL reset footer turns on; 3) also, MBL is disconnected before the negative feedback is turned off; and 4) the negative feedback is switched off before the reference voltage is connected to capacitor 302.

In some embodiments, for a confined range of bMAC values (ADC range), ten uniformly spaced reference voltages can be chosen to obtain competent accuracy for the target inference tasks. The ADC range can be determined by the statistical distribution of partial computation results of a DNN algorithm, which tend to have concentrated distribution around bMAC value of 0, in some embodiments.

Figure 5:
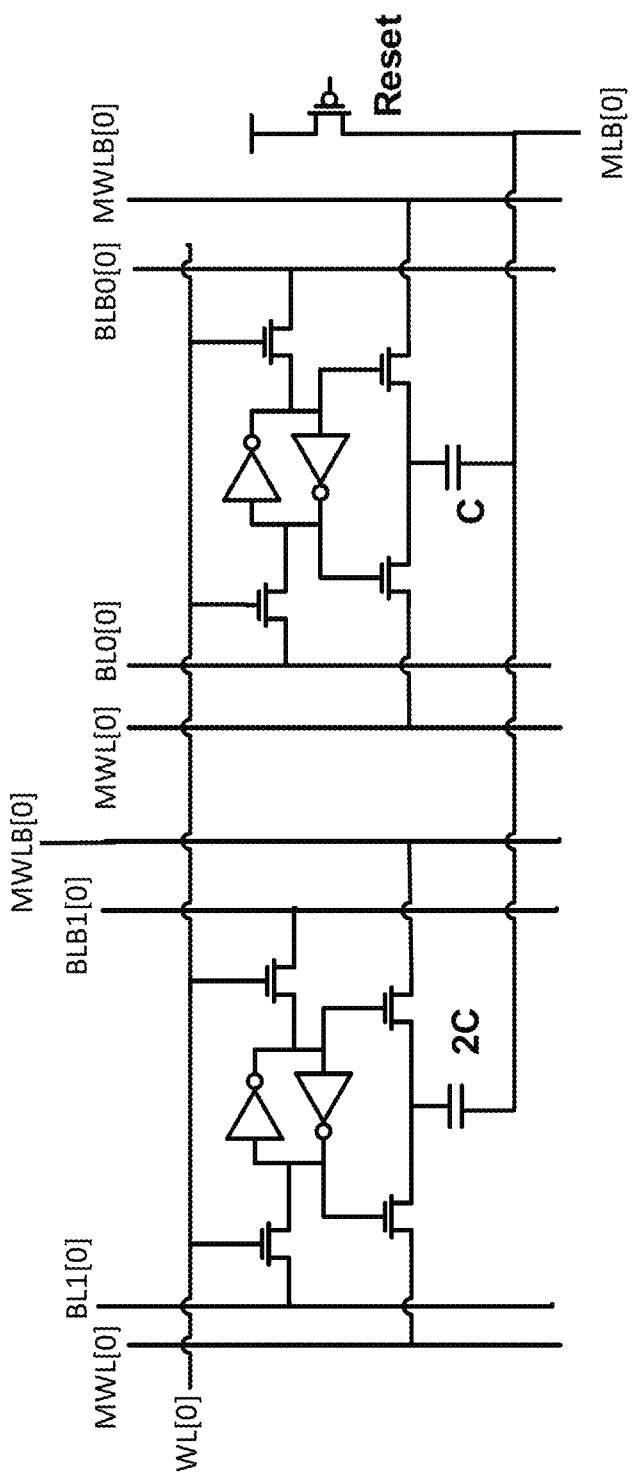
FIG. 5 is an example of a schematic diagram showing how multi-bit weights can be implemented in a C3SRAM macro in accordance with some embodiments.

Turning to FIG. 5, in some embodiments, multiple bitcells each with a different size capacitor can be connected to the same values of WL, MWL, MWLB, and MLB to realize multi-bit weights that can be controlled by two or more bitline pairs, such as: BL0[0], BLB0[0]; BL1[0], BLB1[0]; etc. Although only two bitcells are shown in FIG. 5, three or more bitcells can be used in some embodiment, with each more significant bitcell having a capacitor double the size of the capacitor in next less significant bitcell.

Figure 6:
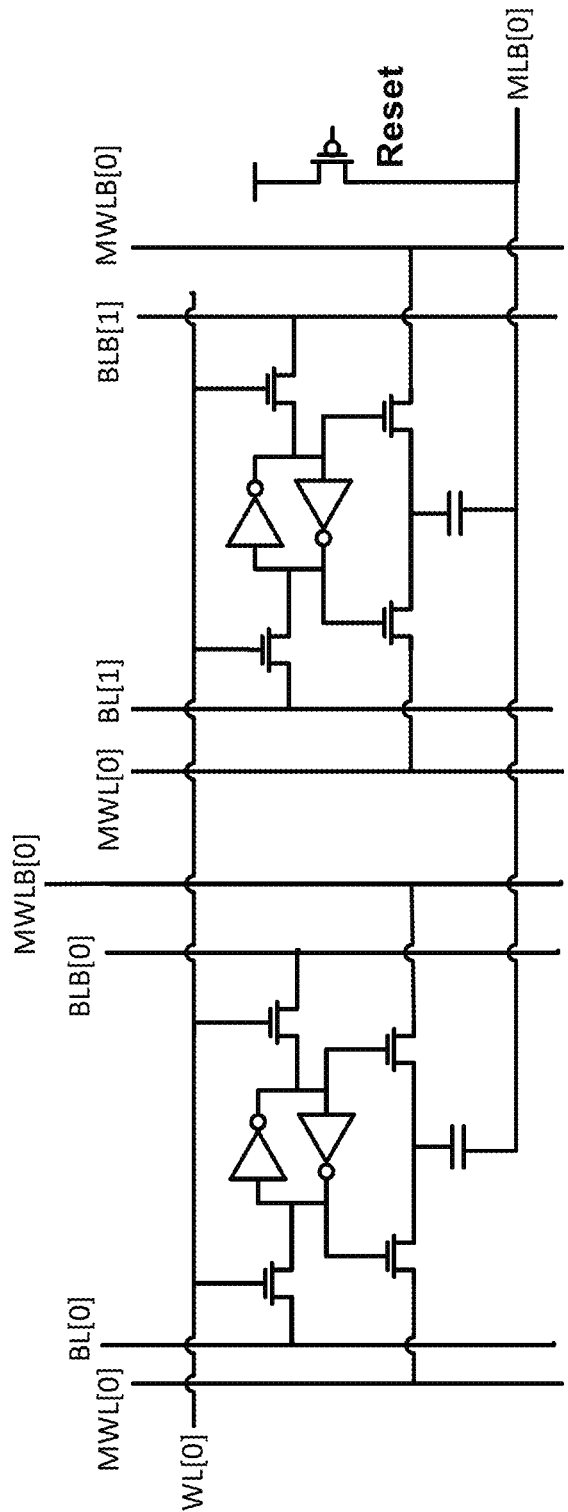
FIG. 6 is an example of a schematic diagram showing a C3SRAM macro configured to accumulate over a row with a row-wise read/write in accordance with some embodiments.

While the circuits of FIG. 1 and FIG. 2A accumulate over a column with a row-wise read/write, in some embodiments a C3SRAM macro can be configured to accumulate over a row with a row-wise read/write as shown in FIG. 6. Likewise, in some embodiments, C3SRAM macros can be defined to accumulate over a column with a column-wise read/write (by defining the columns in FIG. 1 and FIG. 2A as being rows and defining the rows in FIG. 1 and FIG. 2A as being columns) and can be defined to accumulate over a row with a column-wise read/write (by defining the columns in FIG. 6 as being rows and defining the rows in FIG. 6 as being columns).

Figure 7:
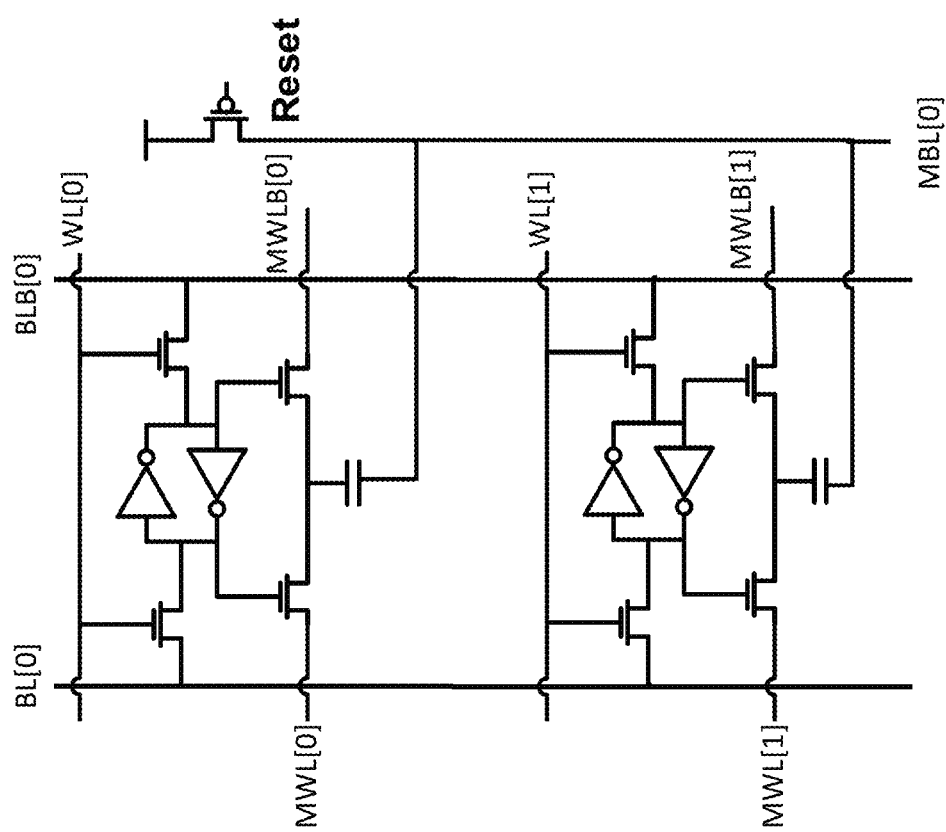
FIG. 7 is an example of a schematic diagram showing a pull-up reset transistor for bitcells in accordance with some embodiments.

While FIG. 2A illustrated an NMOS transistor that pulls the MBL line down to $V_{RST}$, in some embodiments, a PMOS transistor can be used to pull the MBL line up to any suitable $V_{RST}$ as shown in FIG. 7. Likewise, in some embodiments, a transmission gate or passgate can be used to pull the MBL line to any suitable voltage.

Figure 8:
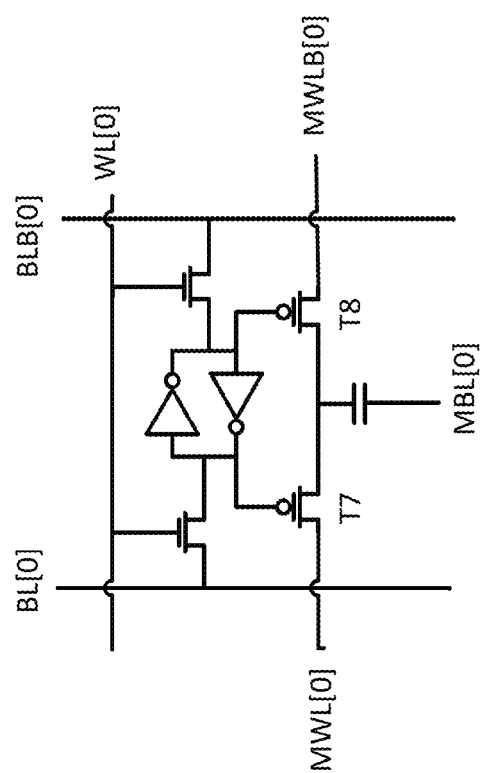
FIG. 8 is an example of a schematic diagram showing an alternate configuration of a bitcell in accordance with some embodiments.

As shown in FIG. 8, in some embodiments, transistors T7 and T8 can be implemented in PMOS transistors instead of NMOS transistors as shown in FIG. 2A. In some embodiments, when implemented using PMOS transistors, the MWL and MWLB lines can be driven between voltages of 0.2 VDC and 1.0 VDC instead of 0.0 VDC and 0.8 VDC as described above. As described herein, a 200 mV offset in the low rail voltage or the high rail voltage may be beneficial for improving accuracy of the C3SRAM. However, any suitable offset value (e.g., 150 mV, 250 mV, etc.) or no offset value can be used in some embodiments.

In some embodiments, one or more C3SRAM macros as described herein can be used to perform the computations of convolution layers and fully connected layers of a DNN.

In some embodiments, the mapping of fully connected layer weights in C3SRAM can be implemented with weights of a layer organized column-wise, and inputs/activations can be applied at each row. In some embodiments, convolutional layer mapping can be performed as an extension of a fully connected layer mapping. For example, mapping a 3×3×256 filter from a convolution layer can be implemented in the same manner as the mapping of nine 256-neuron fully connected layer weights in some embodiments. In some embodiments, channels can be organized in column orientation, and each channel's kernel can be distributed across multiple macros. In some embodiments, partial sums produced by ADCs can be accumulated to generate a pre-activation for each neuron.

In some embodiments, each binary weight of convolution and fully connected layers can be stored in one C3SRAM bitcell. In some embodiments, the macro can compute the partial 256-input MAC operations. Accumulation of the outputs of the macro, max-pooling, and batch normalization can be performed in digital domain, in some embodiments.

Figure 9:
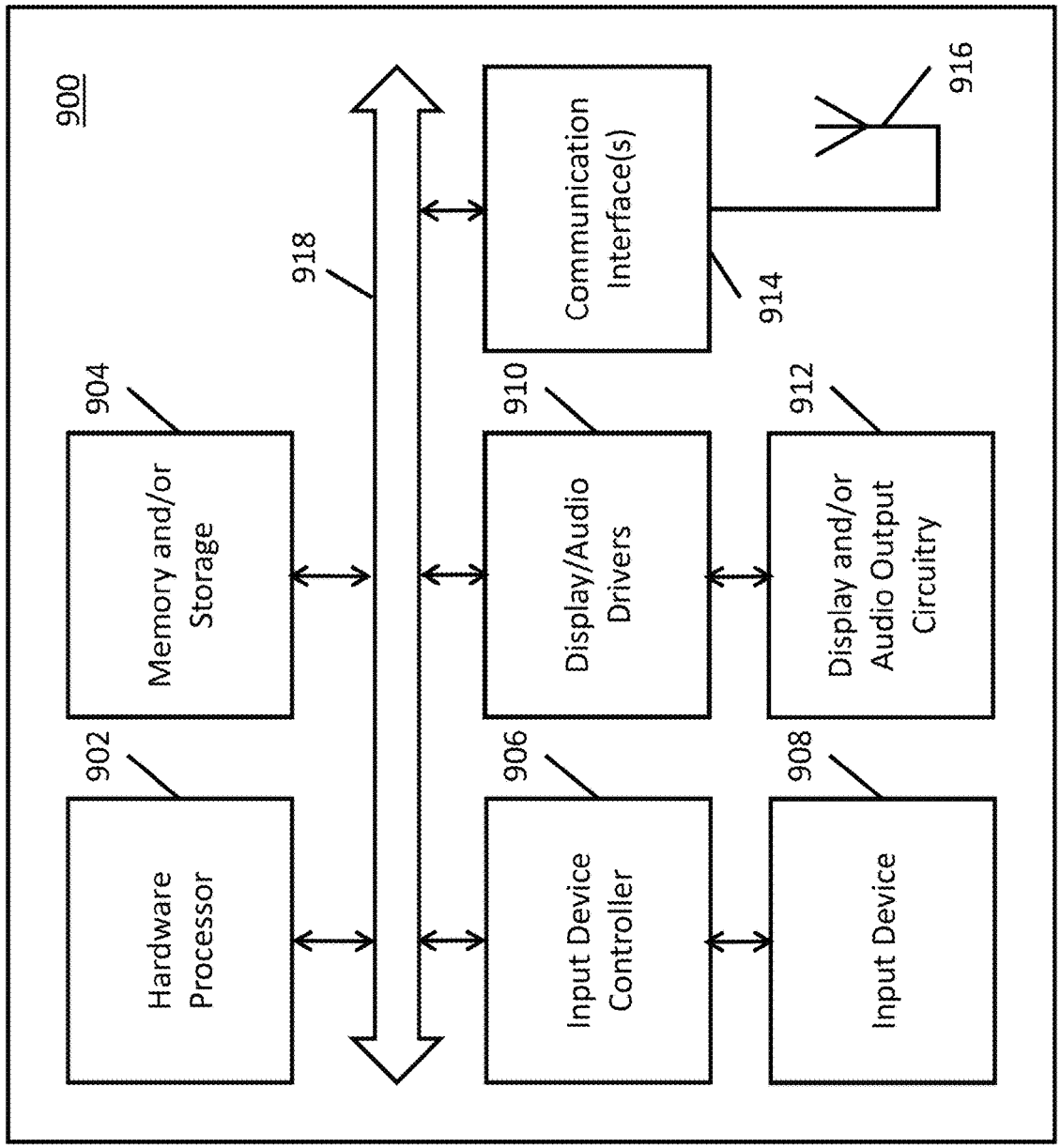
FIG. 9 is an example of a block diagram of components that can be used to implement a neural network in accordance with some embodiments.

As described above, the C3SRAM macro can be used to implement a DNN, a CNN, or any other suitable neural network in some embodiments. In such an application, the C3SRAM macro can be part of any suitable general-purpose computer or special-purpose computer in some embodiments. Any such general-purpose computer or special-purpose computer can include any suitable hardware in some embodiments. For example, as illustrated in example hardware 900 of FIG. 9, such hardware can include hardware processor 902, memory and/or storage 904, an input device controller 906, an input device 908, display/audio drivers 910, display and audio output circuitry 912, communication interface(s) 914, an antenna 916, and a bus 918.

Hardware processor 902 can include any suitable hardware processor, such as a microprocessor, a micro-controller, digital signal processor(s), dedicated logic, and/or any other suitable circuitry for controlling the functioning of a general-purpose computer or a special-purpose computer in some embodiments. In some embodiments, hardware processor 902 can be controlled by a program stored in memory 904.

Memory and/or storage 904 can be any suitable memory and/or storage for storing programs, data, and/or any other suitable information in some embodiments. For example, memory and/or storage 904 can include a C3SRAM macro as described herein, other random access memory, read-only memory, flash memory, hard disk storage, optical media, and/or any other suitable memory.

Input device controller 906 can be any suitable circuitry for controlling and receiving input from one or more input devices 908 in some embodiments. For example, input device controller 906 can be circuitry for receiving input from a touchscreen, from a keyboard, from one or more buttons, from a voice recognition circuit, from a microphone, from a camera, from an optical sensor, from an accelerometer, from a temperature sensor, from a near field sensor, from a pressure sensor, from an encoder, and/or any other type of input device.

Display/audio drivers 910 can be any suitable circuitry for controlling and driving output to one or more display/audio output devices 1912 in some embodiments. For example, display/audio drivers 910 can be circuitry for driving a touchscreen, a flat-panel display, a cathode ray tube display, a projector, a speaker or speakers, and/or any other suitable display and/or presentation devices.

Communication interface(s) 914 can be any suitable circuitry for interfacing with one or more communication networks. For example, interface(s) 914 can include network interface card circuitry, wireless communication circuitry, and/or any other suitable type of communication network circuitry.

Antenna 916 can be any suitable one or more antennas for wirelessly communicating with a communication network in some embodiments. In some embodiments, antenna 916 can be omitted.

Bus 918 can be any suitable mechanism for communicating between two or more components 902, 904, 906, 910, and 914 in some embodiments.

Any other suitable components can be included in hardware 900 in accordance with some embodiments.

In some embodiments, any suitable computer readable media can be used for storing instructions for performing the functions and/or processes herein. For example, in some embodiments, computer readable media can be transitory or non-transitory. For example, non-transitory computer readable media can include media such as non-transitory forms of magnetic media (such as hard disks, floppy disks, and/or any other suitable magnetic media), non-transitory forms of optical media (such as compact discs, digital video discs, Blu-ray discs, and/or any other suitable optical media), non-transitory forms of semiconductor media (such as flash memory, electrically programmable read-only memory (EPROM), electrically erasable programmable read-only memory (EEPROM), and/or any other suitable semiconductor media), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

Accordingly, circuits and methods for in-memory computing are provided.

Although the disclosed subject matter has been described and illustrated in the foregoing illustrative embodiments, the present disclosure has been made only by way of example, and numerous changes in the details of implementation of the disclosed subject matter can be made without departing from the spirit and scope of the disclosed subject matter, which is limited only by the claims that follow. Features of the disclosed embodiments can be combined and rearranged in various ways.

What is claimed is:

1. A circuit for a bitcell, comprising:
a first switch having a first side, a second side, and a control input wherein the first side of the first switch is connected to a first supply voltage;
a second switch having a first side, a second side, and a control input wherein the control input of the second switch is connected to the second side of the first switch, and the second side of the second switch is connected to the control input of the first switch;
a third switch having a first side, a second side, and a control input wherein the first side of the third switch is connected to the second side of the first switch, the second side of the third switch is connected to a second supply voltage, and the control input of the third switch is connected to the control input of the first switch;
a fourth switch having a first side, a second side, and a control input wherein the first side of the fourth switch is connected to the second side of the second switch, the second side of the fourth switch is connected to the second supply voltage, and the control input of the fourth switch is connected to the control input of the second switch;
a fifth switch having a first side, a second side, and a control input wherein the first side of the fifth switch is connected to the second side of the first switch;
a sixth switch having a first side, a second side, and a control input wherein the first side of the sixth switch is connected to the second side of the second switch and the control input of the sixth switch is connected to the control input of the fifth switch;
a seventh switch having a first side, a second side, and a control input wherein the control input of the seventh switch is connected to the second side of the first switch;
an eighth switch having a first side, a second side, and a control input wherein the control input of the eighth switch is connected to the second side of the second switch; and
a first capacitor having a first side and a second side wherein the first side of the first capacitor is connected to the first side of the seventh switch and the first side of the eighth switch.

2. The circuit of claim 1, further comprising
a ninth switch having a first side, a second side, and a control input wherein the first side of the ninth switch is connected to the first supply voltage;
a tenth switch having a first side, a second side, and a control input wherein the control input of the tenth switch is connected to the second side of the ninth switch, and the second side of the tenth switch is connected to the control input of the ninth switch;
an eleventh switch having a first side, a second side, and a control input wherein the first side of the eleventh switch is connected to the second side of the ninth switch, the second side of the eleventh switch is connected to the second supply voltage, and the control input of the eleventh switch is connected to the control input of the ninth switch;
a twelfth switch having a first side, a second side, and a control input wherein the first side of the twelfth switch is connected to the second side of the tenth switch, the second side of the twelfth switch is connected to the second supply voltage, and the control input of the twelfth switch is connected to the control input of the tenth switch;
a thirteenth switch having a first side, a second side, and a control input wherein the first side of the thirteenth switch is connected to the second side of the ninth switch and the second side of the thirteenth switch is connected to the second side of the fifth switch;
a fourteenth switch having a first side, a second side, and a control input wherein the first side of the fourteenth switch is connected to the second side of the tenth switch, the control input of the fourteenth switch is connected to the control input of the thirteenth switch, the second side of the fourteenth switch is connected to the second side of the sixth switch;

a fifteenth switch having a first side, a second side, and a control input wherein the control input of the fifteenth switch is connected to the second side of the ninth switch;

a sixteenth switch having a first side, a second side, and a control input wherein the control input of the sixteenth switch is connected to the second side of the tenth switch; and a second capacitor having a first side and a second side wherein the first side of the second capacitor is connected to the first side of the fifteenth switch and the first side of the sixteenth switch.

3. The circuit of claim 2, wherein the second side of the second capacitor is connected to the second side of the first capacitor and wherein during a first time period the first side of the first capacitor, the first side of the second capacitor, the second side of the first capacitor, and the second side of the second capacitor are all connected to a reset voltage.

4. The circuit of claim 2, wherein the second side of the second capacitor is connected to the second side of the first capacitor and wherein during a second time period the first side of the first capacitor is connected to a third supply voltage and the first side of the second capacitor is connected to the second supply voltage.

5. The circuit of claim 4, wherein the third supply voltage is less than the first supply voltage and greater than the second supply voltage.

6. The circuit of claim 5, wherein the first supply voltage is higher than the third supply voltage by an amount greater than a threshold voltage of the seventh transistor.

7. The circuit of claim 2, further comprising a seventeenth switch having a first side, a second side, and a control input wherein the first side of the seventeenth switch is connected to the first supply voltage;

a eighteenth switch having a first side, a second side, and a control input wherein the control input of the eighteenth switch is connected to the second side of the seventeenth switch, and the second side of the eighteenth switch is connected to the control input of the seventeenth switch;

a nineteenth switch having a first side, a second side, and a control input wherein the first side of the nineteenth switch is connected to the second side of the seventeenth switch, the second side of the nineteenth switch is connected to the second supply voltage, and the control input of the nineteenth switch is connected to the control input of the seventeenth switch;

a twentieth switch having a first side, a second side, and a control input wherein the first side of the twentieth switch is connected to the second side of the eighteenth switch, the second side of the twentieth switch is connected to the second supply voltage, and the control input of the twentieth switch is connected to the control input of the eighteenth switch;

a twenty first switch having a first side, a second side, and a control input wherein the first side of the twenty first switch is connected to the second side of the seventeenth switch and the control input of the twenty first switch is connected to the control input of the fifth switch and to the control input of the sixth switch;

a twenty second switch having a first side, a second side, and a control input wherein the first side of the a twenty second switch is connected to the second side of the eighteenth switch and the control input of the twenty second switch is connected to the control input of the twenty first switch;

a twenty third switch having a first side, a second side, and a control input wherein the control input of the twenty third switch is connected to the second side of the seventeenth switch;

a twenty fourth switch having a first side, a second side, and a control input wherein the control input of the twenty fourth switch is connected to the second side of the eighteenth switch; and a third capacitor having a first side and a second side wherein the first side of the third capacitor is connected to the first side of the twenty third switch and the first side of the twenty fourth switch.

8. The circuit of claim 7, wherein the second side of the second capacitor is connected to the second side of the third capacitor.

9. The circuit of claim 7, wherein the third capacitor is twice the size of the first capacitor.

10. The circuit of claim 1, further comprising a reset switch connected to the second side of the first capacitor that discharges the capacitor when on.

11. The circuit of claim 10, wherein the reset switch is an NMOS transistor.

12. The circuit of claim 10, wherein the reset switch is an PMOS transistor.

13. The circuit of claim 10, wherein the reset switch is a transmission gate.

14. The circuit of claim 1, further comprising an analog to digital converter (ADC) having an input and an output, wherein the input is connected to the second side of the first capacitor.

15. The circuit of claim 14, further comprising:

an adder having a first input, a second input, and an output, wherein the first input of the adder is connected to the output of the ADC;

a register having an input and an output, wherein the input of the register is connected to the output of the adder; and a shifter having an input and an output, wherein the input of the shifter is connected to the output of the register and the output of the shifter is connected to the second input of the adder.

16. The circuit of claim 1, wherein the seventh transistor and the eighth transistor are NMOS transistors.

17. The circuit of claim 1, wherein the seventh transistor and the eighth transistor are PMOS transistors.

* * * * *